(12) United States Patent
He

(10) Patent No.: US 10,332,453 B2
(45) Date of Patent: Jun. 25, 2019

(54) DIGITAL DRIVING METHOD FOR OLED DISPLAY DEVICE

(71) Applicant: Shenzhen China Star Optoelectronics Semiconductor Display Technology Co., Ltd., Shenzhen (CN)

(72) Inventor: Jian He, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/744,832

(22) PCT Filed: Jul. 13, 2017

(86) PCT No.: PCT/CN2017/092861
§ 371 (c)(1),
(2) Date: Jan. 15, 2018

(87) PCT Pub. No.: WO2018/223492
PCT Pub. Date: Dec. 13, 2018

(65) Prior Publication Data
US 2019/0012964 A1 Jan. 10, 2019

(30) Foreign Application Priority Data

Jun. 6, 2017 (CN) .......................... 2017 1 0419710

(51) Int. Cl.
*G09G 3/3258* (2016.01)
*H01L 51/52* (2006.01)
(Continued)

(52) U.S. Cl.
CPC ......... *G09G 3/3258* (2013.01); *G09G 3/2022* (2013.01); *G09G 3/2029* (2013.01);
(Continued)

(58) Field of Classification Search
CPC .. G09G 3/3258; G09G 3/2022; G09G 3/3233; G09G 3/2029; G09G 2340/0435;
(Continued)

(56) References Cited

U.S. PATENT DOCUMENTS 6,023,259 A    2/2000   Howard et al.
2003/0057895 A1*   3/2003   Kimura ................ G09G 3/3233
                                                        315/370
(Continued)

FOREIGN PATENT DOCUMENTS

CN    101739948 A    6/2010
CN    103559860 A    2/2014
(Continued)

*Primary Examiner* — Amit Chatly
(74) *Attorney, Agent, or Firm* — Leong C. Lei

(57) ABSTRACT

The invention provides a digital driving method for OLED display device, by using a 3T1C pixel driving circuit comprising a first TFT, a second TFT, a third TFT, a capacitor, and an OLED to drive each sub-pixel, and by dividing a frame of OLED display device into a plurality of unequal-length sub-frames and equal-length sub-frames, and by changing the time gap between the first TFT charging and the third TFT discharging to control the illuminating time of each equal-length sub-frame. By combining the unequal-length and equal-length sub-frames, compared to the unequal-length sub-frame driving only in prior arts, the method can effectively reduce required hardware specification, improve luminance of OLED display device, and ensure the display quality of the OLED display device.

14 Claims, 7 Drawing Sheets

(51) Int. Cl.
*H01L 27/12* (2006.01)
*G09G 3/20* (2006.01)
*G09G 3/3233* (2016.01)

(52) U.S. Cl.
CPC ....... *G09G 3/3233* (2013.01); *H01L 27/1214* (2013.01); *H01L 51/5206* (2013.01); *H01L 51/5221* (2013.01); *G09G 2340/0435* (2013.01); *G09G 2360/16* (2013.01)

(58) Field of Classification Search
CPC ............ G09G 2360/16; H01L 27/1214; H01L 51/5206; H01L 51/5221
See application file for complete search history.

(56) References Cited

U.S. PATENT DOCUMENTS

| | | | | |
|---|---|---|---|---|
| 2015/0302795 A1* | 10/2015 | Genoe | ................ | G09G 3/2018 345/691 |
| 2016/0118012 A1* | 4/2016 | Chang | ................ | G09G 3/2022 345/212 |
| 2016/0189597 A1* | 6/2016 | Park | ........................ | G09G 3/20 345/694 |
| 2016/0189603 A1* | 6/2016 | Lee | ...................... | G09G 3/3258 345/212 |

FOREIGN PATENT DOCUMENTS

| | | |
|---|---|---|
| CN | 104575380 A | 4/2015 |
| CN | 105047139 A | 11/2015 |

\* cited by examiner

DIGITAL DRIVING METHOD FOR OLED DISPLAY DEVICE

BACKGROUND OF THE INVENTION

1. Field of the Invention

The present invention relates to the field of display techniques, and in particular to a digital driving method for OLED display device.

2. The Related Arts

The organic light emitting diode (OLED) display panel provides the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

The OLED display device comprises a plurality of pixels arranged in an array, and uses pixel driving circuit to drive the OLED to emit light. The conventional pixel driving circuit is as shown in FIG. 1, comprising: a switch thin film transistor (TFT) T10, a driving TFT T20, a storage capacitor C10, and an OLED D. The driving method can be either analog driving or digital driving. When using the analog driving method, the threshold voltage (Vth) of driving TFT T20 may drift because of operating for a long duration in the saturation range, resulting in uneven luminance of panel when displaying images, and affecting the display quality.

In the digital driving method for OLED display device, the gate of the driving TFT T20 only outputs two gamma voltage levels: a highest gamma level (GM1) making the OLED brightest, and a lowest gamma level (GM9) making the OLED darkest. According to the I-V (current-voltage) equation of transistor:

$$I_{ds,sat} = k*(V_{gs}-V_{th,T20})^2 = k*(V_A-V_B-V_{th,T20})^2$$

Wherein, $I_{ds,sat}$ is the conductive current of the transistor, k is the intrinsic conductivity factor, $V_{gs}$ is the gate-source voltage of the driving TFT T20, $V_{th,T20}$ is the threshold voltage of driving TFT T20, $V_A$ is the gate voltage of driving TFT T20, and VB is the source voltage of driving TFT T20. Because of the device degradation or non-consistency, the change amount ΔVth of the threshold voltage Vth of the driving TFT T20 is smaller with respective to the change of (VA-VB). Therefore, compared to analog driving method, the digital driving method can effectively suppress the uneven luminance problem in OLED.

The known digital driving method uses two different approaches: the first is unequal sub-frame (sub-frame), and the other is equal sub-frame.

As shown in FIG. 2, in the digital driving method with unequal sub-frame, a normal frame is divided into a plurality of sub-frames (sub-frame), and the time weights of the sub-frames to drive are as follows: 1: ½: ¼: ⅛: 1/16: 1/32: 1/64: 1/128. By controlling the sub-frame luminance to generate pulse width modulation (PWM) luminance signal and combining with the temporal integral theory for human eye on luminance sensing, digital voltages (GM1 and GM9) can be used to display images of different grayscales. However, this approach has a high demand on the hardware specification. Take the 8 bits driving as example, the frame rate of the shortest sub-frame reaches 153000 Hz, which is hard to achieve for known hardware.

In the digital driving method with equal sub-frame, a discharging TFT must be added to the pixel driving circuit in FIG. 1. The discharging TFT is for discharging the gate of the driving TFT, as shown in FIG. 3. The digital driving method with equal sub-frame, by dividing a frame into a plurality of equal-duration sub-frames and by controlling the time gap between the charging of the switch TFT and the discharging of the discharging TFT, achieves the different illuminating times for the pixel in different sub-frames, and the pixel is driven to illuminate according to the time weight 1: ½: ¼: ⅛: 1/16: 1/32: 1/64: 1/128. To generate PWWWWW-WWM luminance signal. This approach, although reducing demand on the hardware specification, the overall luminance is low because the pixel does not illuminate most of the time. Take the 8 sub-frames as example, the pixel with 255 grayscale (8 sub-frames illumination) only illuminates about 25% of a frame time, i.e., the luminance is only 25% for 255 grayscale under the analog driving method.

SUMMARY OF THE INVENTION

The object of the present invention is to provide a digital driving method for OLED display device, able to effectively reduce required hardware specification, improve luminance of OLED display device, and ensure the display quality of the OLED display device.

To achieve the above object, the present invention provides a digital driving method for OLED display device, comprising the steps of:

Step 1: providing an OLED display device, the OLED display device comprising a plurality of sub-pixels arranged in an array, each sub-pixel being disposed with a pixel driving circuit, the pixel driving circuit comprising: a first thin film transistor (TFT), a second TFT, a third TFT, a storage capacitor, and an OLED;

the second TFT being for driving the OLED to emit light, the first TFT being for charging a gate of the second TFT, the third TFT being for discharging the gate of the second TFT, the storage capacitor being for storing a voltage of the gate of the second TFT, and the voltage of the gate of the second TFT only being at a lowest gamma level or a highest gamma level;

Step 2: dividing a frame of the OLED display device into a plurality of sub-frames, and the plurality of sub-frames comprising: a plurality of unequal-length sub-frames and a plurality of equal-length sub-frames, having different time weights, the equal-length sub-frames being half the length of the unequal-length sub-frame with the lowest time weight;

Step 3: based on grayscale data of a frame to be displayed, driving each sub-frame to output, and during each sub-frame outputting, changing a time gap between the first TFT charging and the third TFT discharging to control illuminating time of each equal-length sub-frame.

According to a preferred embodiment of the present invention, in step 2, the number of the plurality of unequal-length sub-frames and the number of the equal-length sub-frames are based on a maximum frame rate of the OLED display device, and the unequal-length sub-frame with the lowest time weight has a frame rate less than the maximum frame rate of the OLED display device.

According to a preferred embodiment of the present invention, the grayscale data of the OLED display device comprises 8 bits, and in step 2, a frame of the OLED display device is divided into 8 sub-frames.

According to a preferred embodiment of the present invention, the maximum frame rate of the OLED display device is 1140 Hz.

According to a preferred embodiment of the present invention, the sub-frames comprises three unequal-length sub-frames and five equal-length sub-frames, and the time weights of the three unequal-length sub-frames are: 1: ½: ¼.

According to a preferred embodiment of the present invention, the maximum frame rate of the OLED display device is 720 Hz.

According to a preferred embodiment of the present invention, the 8 sub-frames comprises two unequal-length sub-frames and six equal-length sub-frames, and the time weights of the two unequal-length sub-frames are: 1: ½.

According to a preferred embodiment of the present invention, the grayscale data of the OLED display device comprises 6 bits, and in step 2, a frame of the OLED display device is divided into 6 sub-frames.

According to a preferred embodiment of the present invention, the first TFT has a gate connected to a first scan signal, a source connected to a data signal, and a drain connected to a first node;

the second TFT has a gate connected to the first node, a source connected to an anode of the OLED, and a drain connected to a power source positive voltage;

the third TFT has a gate connected to a second scan signal, a source connected to a reference voltage, and a drain connected to the first node;

the capacitor has one end connected to the first node and the other end connected to the drain of the second TFT; and the OLED has a cathode connected to a power source negative voltage.

According to a preferred embodiment of the present invention, the reference voltage equals to 0.

The present invention also provides a digital driving method for OLED display device, comprising the steps of:

Step 1: providing an OLED display device, the OLED display device comprising a plurality of sub-pixels arranged in an array, each sub-pixel being disposed with a pixel driving circuit, the pixel driving circuit comprising: a first thin film transistor (TFT), a second TFT, a third TFT, a storage capacitor, and an OLED;

the second TFT being for driving the OLED to emit light, the first TFT being for charging a gate of the second TFT, the third TFT being for discharging the gate of the second TFT, the storage capacitor being for storing a voltage of the gate of the second TFT, and the voltage of the gate of the second TFT only being at a lowest gamma level or a highest gamma level;

Step 2: dividing a frame of the OLED display device into a plurality of sub-frames, and the plurality of sub-frames comprising: a plurality of unequal-length sub-frames and a plurality of equal-length sub-frames, having different time weights, the equal-length sub-frames being half the length of the unequal-length sub-frame with the lowest time weight;

Step 3: based on grayscale data of a frame to be displayed, driving each sub-frame to output, and during each sub-frame outputting, changing a time gap between the first TFT charging and the third TFT discharging to control illuminating time of each equal-length sub-frame;

Wherein, in step 2, the number of the plurality of unequal-length sub-frames and the number of the equal-length sub-frames are based on a maximum frame rate of the OLED display device, and the unequal-length sub-frame with the lowest time weight has a frame rate less than the maximum frame rate of the OLED display device;

wherein the grayscale data of the OLED display device comprises 8 bits, and in step 2, a frame of the OLED display device is divided into 8 sub-frames;

wherein the first TFT has a gate connected to a first scan signal, a source connected to a data signal, and a drain connected to a first node;

the second TFT has a gate connected to the first node, a source connected to an anode of the OLED, and a drain connected to a power source positive voltage;

the third TFT has a gate connected to a second scan signal, a source connected to a reference voltage, and a drain connected to the first node;

the capacitor has one end connected to the first node and the other end connected to the drain of the second TFT; and the OLED has a cathode connected to a power source negative voltage;

wherein the reference voltage equals to 0.

Compared to the known techniques, the present invention provides the following advantages. The present invention provides a digital driving method for OLED display device, by using a 3T1C pixel driving circuit comprising a first TFT, a second TFT, a third TFT, a capacitor, and an OLED to drive each sub-pixel, and by dividing a frame of OLED display device into a plurality of unequal-length sub-frames and equal-length sub-frames, and by changing the time gap between the first TFT charging and the third TFT discharging to control the illuminating time of each equal-length sub-frame. By combining the unequal-length and equal-length sub-frames, compared to the unequal-length sub-frame driving only in prior arts, the method can effectively reduce required hardware specification, improve luminance of OLED display device, and ensure the display quality of the OLED display device.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
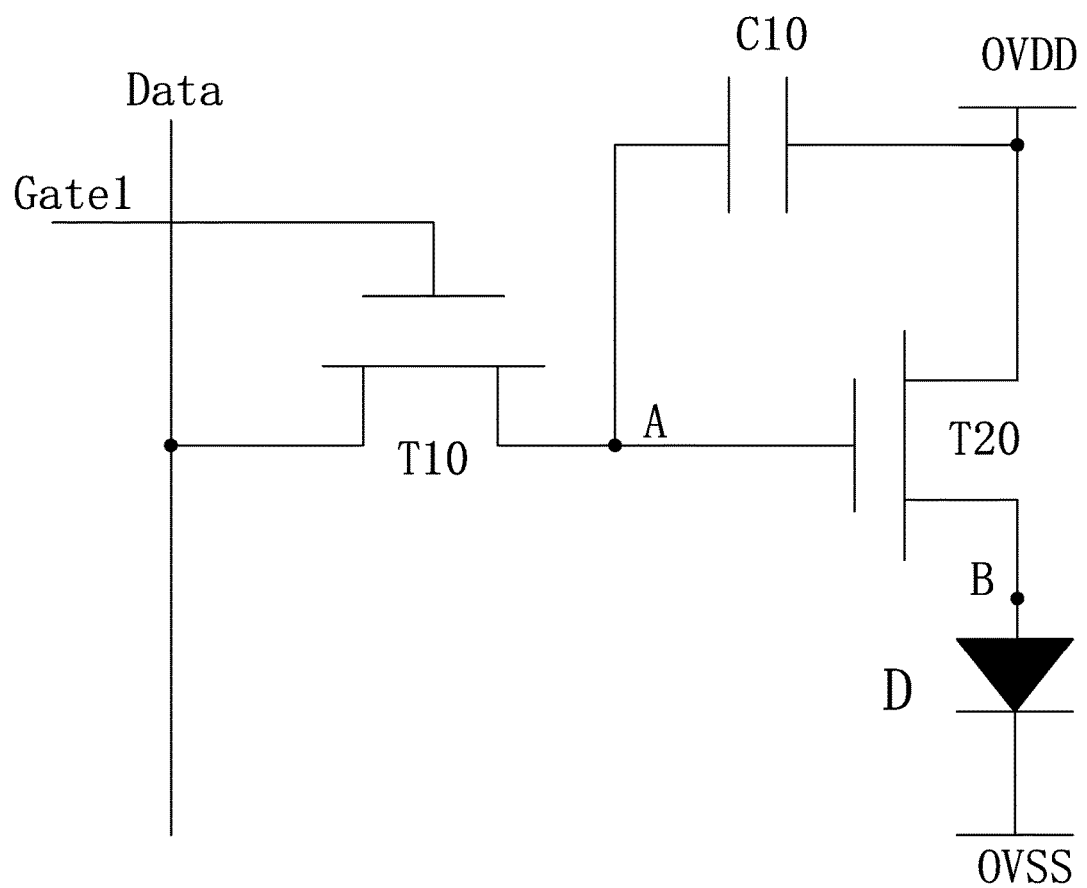
FIG. 1 is a schematic view showing a known driving circuit for OLED display device.
Figure 2:
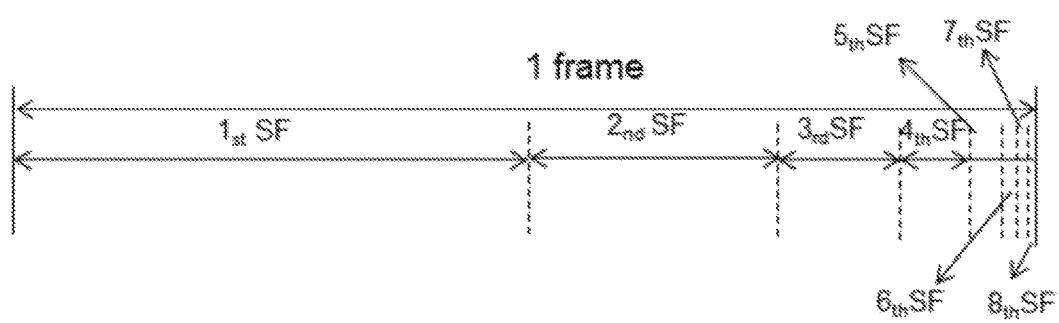
FIG. 2 is a schematic view showing the timing of the known unequal-length sub-frame driving approach.
Figure 3:
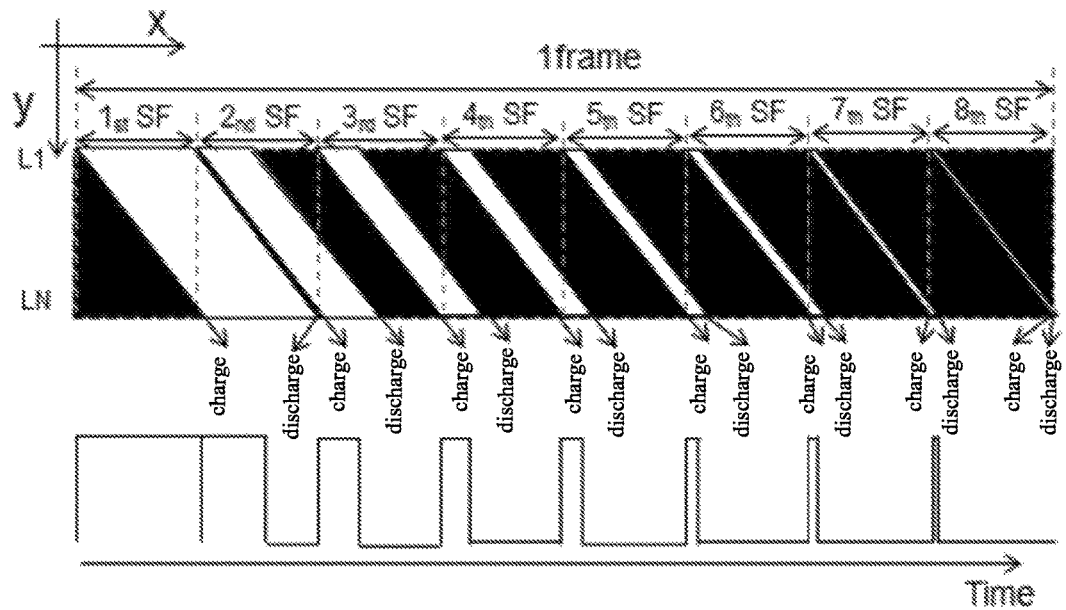
FIG. 3 is a schematic view showing the timing of the known equal-length sub-frame driving approach.
Figure 4:
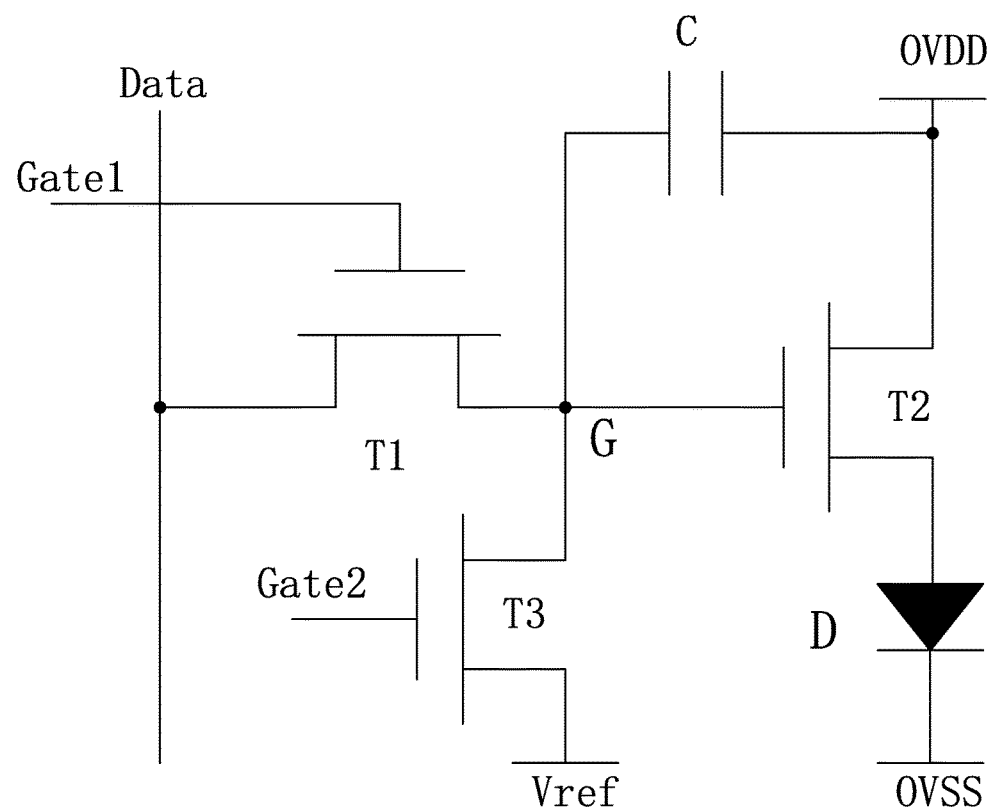
FIG. 4 is a schematic view showing step 1 of the digital driving method for OLED display device provided by an embodiment of the present invention.
Figure 7:
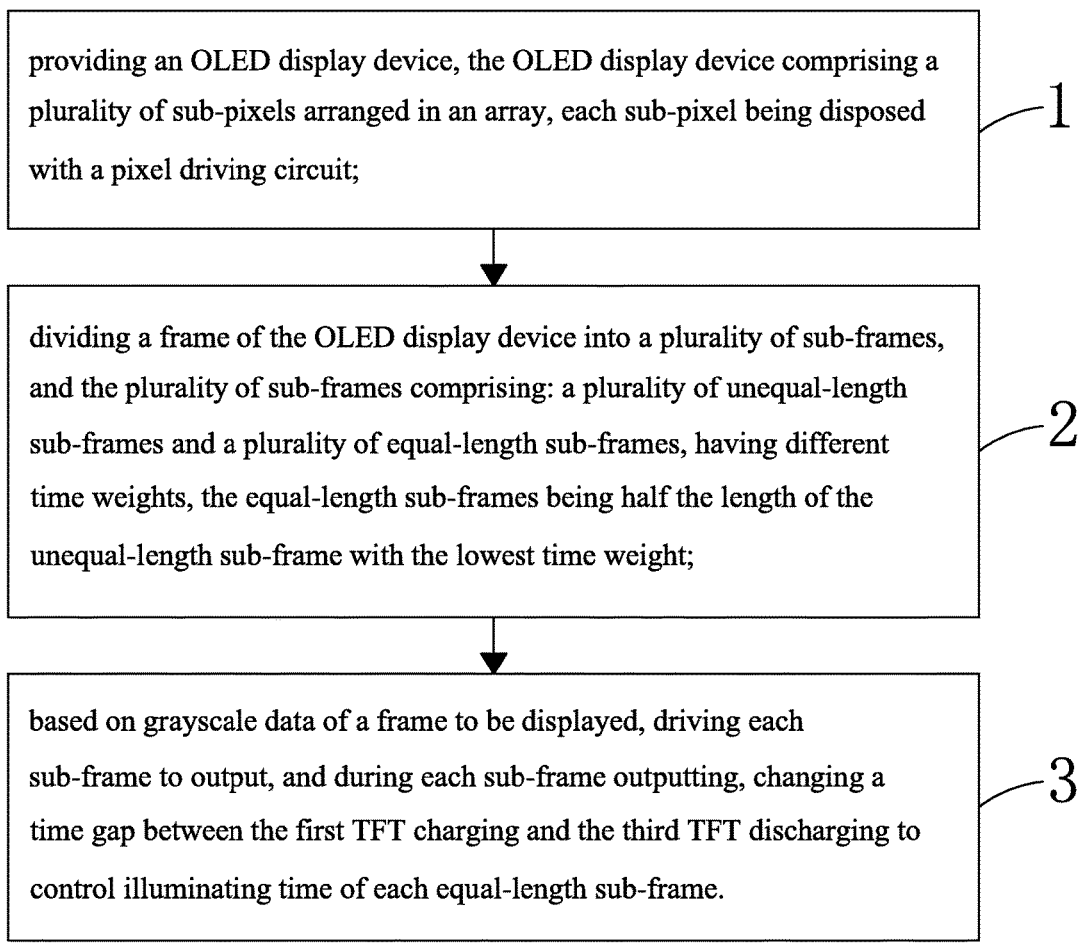
FIG. 7 is a schematic view showing a flowchart of the digital driving method for OLED display device provided by another embodiment of the present invention.

Referring to FIG. 7, the present invention provides a digital driving method for OLED display pane, comprising the steps of:

Step 1: as shown in FIG. 4, providing an OLED display device, the OLED display device comprising a plurality of sub-pixels arranged in an array, each sub-pixel being disposed with a pixel driving circuit, the pixel driving circuit comprising: a first thin film transistor (TFT) T1, a second TFT T2, a third TFT T3, a storage capacitor C, and an OLED D;

Wherein the first TFT T1 has a gate connected to a first scan signal Gate1, a source connected to a data signal Data, and a drain connected to a first node G; the second TFT T2 has a gate connected to the first node G, a source connected to an anode of the OLED D, and a drain connected to a power source positive voltage OVDD; the third TFT T3 has a gate connected to a second scan signal Gate2, a source connected to a reference voltage Vref, and a drain connected to the first node G; the capacitor C has one end connected to the first node G and the other end connected to the drain of the second TFT T2; and the OLED D has a cathode connected to a power source negative voltage OVSS. Specifically, the reference voltage equals to 0, or a negative voltage close to 0.

Specifically, the second TFT T2 is for driving the OLED D to emit light, the first TFT T1 is for charging the gate (i.e., the first node G) of the second TFT T2, the third TFT T3 is for discharging the gate of the second TFT T2, the storage capacitor C is for storing a voltage of the gate of the second TFT, and the voltage of the gate of the second TFT T2 is only at a lowest gamma level or a highest gamma level.

Figure 5:
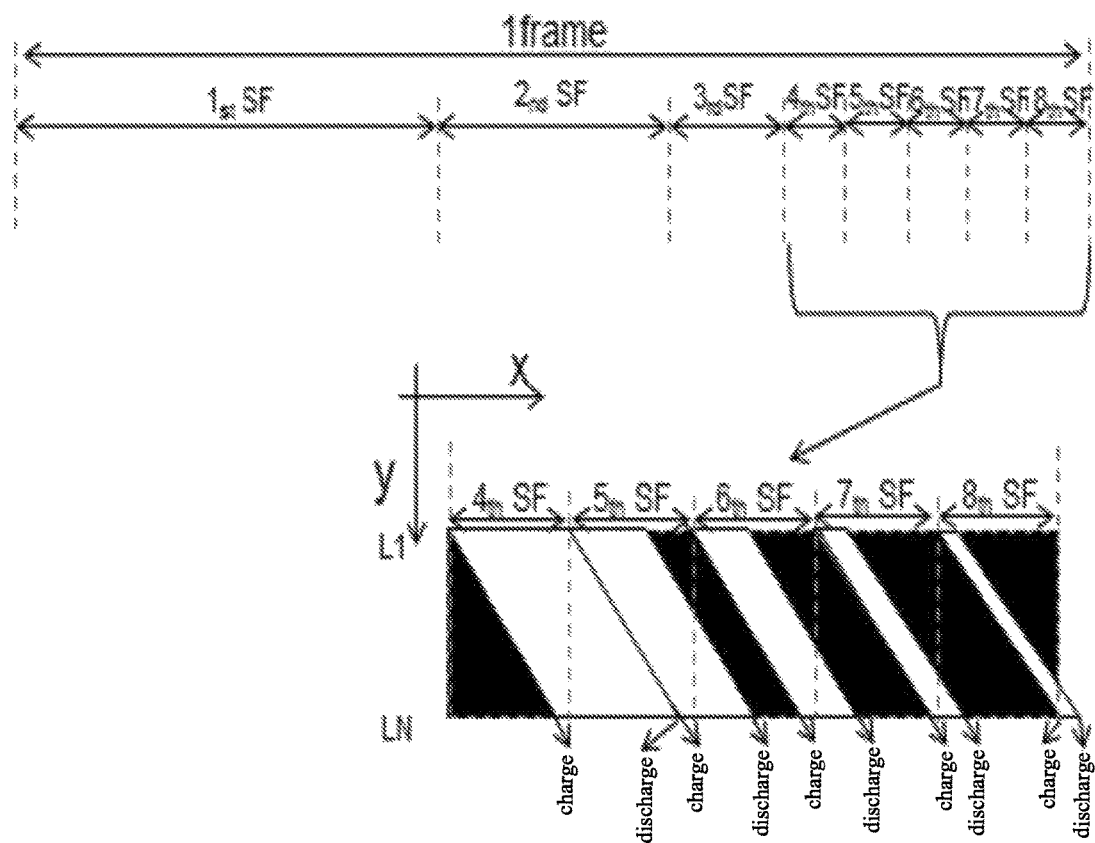
FIG. 5 is a schematic view showing step 2 and step 3 of the digital driving method for OLED display device provided by the first embodiment of the present invention.
Figure 6:
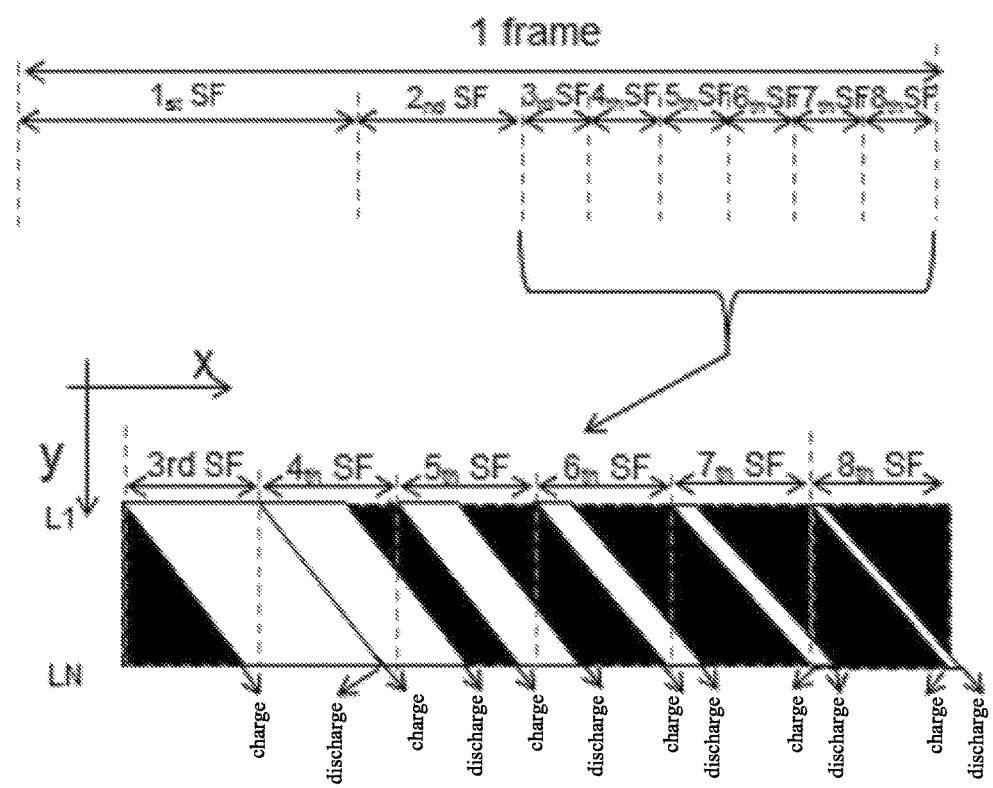
FIG. 6 is a schematic view showing step 2 and step 3 of the digital driving method for OLED display device provided by the second embodiment of the present invention.

Step 2: as shown in FIG. 5 or FIG. 6, dividing a frame of the OLED display device into a plurality of sub-frames (sub-frame), and the plurality of sub-frames comprising: a plurality of unequal-length sub-frames having different time weights, and a plurality of equal-length sub-frames, the equal-length sub-frames being half the length of the unequal-length sub-frame with the lowest time weight.

Specifically, the number of the plurality of unequal-length sub-frames and the number of the equal-length sub-frames in step 2 are determined based on a maximum frame rate of the OLED display device, so that the frame rate of the equal-length sub-frames is less than the maximum frame rate of the OLED display device. By combining the unequal-length and equal-length sub-frames, compared to the unequal-length sub-frame driving only in prior arts, the method can effectively reduce required hardware specification (frame rate) to ensure the applicability of the digital driving method, improve luminance of OLED display device, and ensure the display quality of the OLED display device.

For example, as shown in FIG. 5, in the first embodiment of the present invention, the maximum frame rate of the OLED display device is 1140 HZ, and the grayscale data of the OLED display device comprises 8 bits, and in step 2, a frame of the OLED display device is divided into 8 sub-frames; wherein the 8 sub-frames comprises three unequal-length sub-frames and the time weights of the three unequal-length sub-frames are: 1: ½: ¼; the remaining five sub-frames are equal-length sub-frames. The length of the equal-length sub-frames is half of the length of the unequal-length sub-frame with time weight ¼.

In the second embodiment of the present invention, as shown in FIG. 6, the maximum frame rate of the OLED display device is 720 HZ, and the grayscale data of the OLED display device comprises 8 bits, and in step 2, a frame of the OLED display device is divided into 8 sub-frames; wherein the 8 sub-frames comprises two unequal-length sub-frames and the time weights of the two unequal-length sub-frames are: 1: ½; the remaining six sub-frames are equal-length sub-frames. The length of the equal-length sub-frames is half of the length of the unequal-length sub-frame with time weight ½.

It should be noted that, in other embodiments of the present invention, the grayscale data of the OLED display device comprises 6 bits, and in step 2, a frame of the OLED display device is divided into 6 sub-frames; wherein the 6 sub-frames comprises a plurality of unequal-length sub-frames and equal-length sub-frames, which will not affect the applicability of the present invention.

Step 3: based on grayscale data of a frame to be displayed, driving each sub-frame to output, and during each sub-frame outputting, changing a time gap between the charging of the first TFT T1 and the discharging of the third TFT T3 to control illuminating time of each equal-length sub-frame.

Specifically, during the unequal-length sub-frame outputting, the second scan signal gate2 controls the third TFT T3 to stay turned off, i.e., the illuminating time of the unequal-length sub-frames is only equal to the length of the unequal-length sub-frames or equal to 0, while for the equal-length sub-frames, the time gap between the first TFT T1 charging and the third TFT T3 discharging is used to control the illuminating time of each equal-length sub-frame, i.e., the illuminating time of the equal-length sub-frames is commonly determined by the length of the equal-length sub-frames and the time weight corresponding to the equal-length sub-frames.

Specifically, in the first embodiment, the five equal-length sub-frames have the time weights as follows: 1: ½: ¼: ⅛: 1/16, and in the second embodiment, the six equal-length sub-frames have the time weights as follows: 1: ½: ¼: ⅛: 1/16: 1/32.

Moreover, under the same condition of dividing a frame into 8 sub-frames, the first embodiment of the present invention, compared to the prior art using only unequal-length division, the maximum frame rate is reduced from 15300 Hz to 1140 Hz, i.e., the frame rate is reduced by 92.5%; and compared to prior art using only equal-length division, the pixel illuminating time increases from 25% to 85%. The second embodiment of the present invention, compared to the prior art using only unequal-length division, the maximum frame rate is reduced from 15300 Hz to 720 Hz, i.e., the frame rate is reduced by 95.3%; and compared to prior art using only equal-length division, the pixel illuminating time increases from 25% to 66.4%. As such, the present invention, compared to prior arts, can effectively reduce required hardware specification, improve luminance of OLED display device, and ensure the display quality of the OLED display device.

In summary, the present invention provides a digital driving method for OLED display device, by using a 3T1C pixel driving circuit comprising a first TFT, a second TFT, a third TFT, a capacitor, and an OLED to drive each sub-pixel, and by dividing a frame of OLED display device into a plurality of unequal-length sub-frames and equal-length sub-frames, and by changing the time gap between the first TFT charging and the third TFT discharging to control the illuminating time of each equal-length sub-frame. By combining the unequal-length and equal-length sub-frames, compared to the unequal-length sub-frame driving only in prior arts, the method can effectively reduce required hardware specification, improve luminance of OLED display device, and ensure the display quality of the OLED display device.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A digital driving method for organic light-emitting diode (OLED) display device, comprising the steps of: Step 1: providing an OLED display device, the OLED display device comprising a plurality of sub-pixels arranged in an array, each sub-pixel being disposed with a pixel driving circuit, the pixel driving circuit comprising: a first thin film transistor (TFT), a second TFT, a third TFT, a storage capacitor, and an OLED; the second TFT being for driving the OLED to emit light, the first TFT being for charging a gate of the second TFT, the third TFT being for discharging the gate of the second TFT, the storage capacitor being for storing a voltage of the gate of the second TFT, and the voltage of the gate of the second TFT only being at a lowest gamma level or a highest gamma level; Step 2: dividing a frame of the OLED display device into a plurality of sub-frames, and the plurality of sub-frames comprising: a plurality of unequal-length sub-frames and a plurality of equal-length sub-frames, having different time weights, the equal-length sub-frames being half the length of the unequal-length sub-frame with the lowest time weight; Step 3: based on grayscale data of a frame to be displayed, driving each sub-frame to output, and during each sub-frame outputting, changing a time gap between the first TFT charging and the third TFT discharging to control illuminating time of each equal-length sub-frame; and wherein in step 2, the number of the plurality of unequal-length sub-frames and the number of the equal-length sub-frames are based on a maximum frame rate of the OLED display device, and the unequal-length sub-frame with the lowest time weight has a frame rate less than the maximum frame rate of the OLED display device.

2. The digital driving method for OLED display device as claimed in claim 1, wherein the grayscale data of the OLED display device comprises 8 bits, and in step 2, a frame of the OLED display device is divided into 8 sub-frames.

3. The digital driving method for OLED display device as claimed in claim 2, wherein the maximum frame rate of the OLED display device is 1140 Hz.

4. The digital driving method for OLED display device as claimed in claim 3, wherein the 8 sub-frames comprises three unequal-length sub-frames and five equal-length sub-frames, and the time weights of the three unequal-length sub-frames are: 1: ½: ¼.

5. The digital driving method for OLED display device as claimed in claim 2, wherein the maximum frame rate of the OLED display device is 720 Hz.

6. The digital driving method for OLED display device as claimed in claim 5, wherein the 8 sub-frames comprises two unequal-length sub-frames and six equal-length sub-frames, and the time weights of the two unequal-length sub-frames are: 1: ½.

7. The digital driving method for OLED display device as claimed in claim 1, wherein the grayscale data of the OLED display device comprises 6 bits, and in step 2, a frame of the OLED display device is divided into 6 sub-frames.

8. The digital driving method for OLED display device as claimed in claim 1, wherein the first TFT has a gate connected to a first scan signal, a source connected to a data signal, and a drain connected to a first node;
the second TFT has a gate connected to the first node, a source connected to an anode of the OLED, and a drain connected to a power source positive voltage;
the third TFT has a gate connected to a second scan signal, a source connected to a reference voltage, and a drain connected to the first node;
the capacitor has one end connected to the first node and the other end connected to the drain of the second TFT; and the OLED has a cathode connected to a power source negative voltage.

9. The digital driving method for OLED display device as claimed in claim 8, wherein the reference voltage equals to 0.

10. A digital driving method for organic light-emitting diode (OLED) display device, comprising the steps of:
Step 1: providing an OLED display device, the OLED display device comprising a plurality of sub-pixels arranged in an array, each sub-pixel being disposed with a pixel driving circuit, the pixel driving circuit comprising: a first thin film transistor (TFT), a second TFT, a third TFT, a storage capacitor, and an OLED;
the second TFT being for driving the OLED to emit light, the first TFT being for charging a gate of the second TFT, the third TFT being for discharging the gate of the second TFT, the storage capacitor being for storing a voltage of the gate of the second TFT, and the voltage of the gate of the second TFT only being at a lowest gamma level or a highest gamma level;
Step 2: dividing a frame of the OLED display device into a plurality of sub-frames, and the plurality of sub-frames comprising: a plurality of unequal-length sub-frames and a plurality of equal-length sub-frames, having different time weights, the equal-length sub-frames being half the length of the unequal-length sub-frame with the lowest time weight;
Step 3: based on grayscale data of a frame to be displayed, driving each sub-frame to output, and during each sub-frame outputting, changing a time gap between the first TFT charging and the third TFT discharging to control illuminating time of each equal-length sub-frame;
wherein in step 2, the number of the plurality of unequal-length sub-frames and the number of the equal-length sub-frames are based on a maximum frame rate of the OLED display device, and the unequal-length sub-frame with the lowest time weight has a frame rate less than the maximum frame rate of the OLED display device;
wherein the grayscale data of the OLED display device comprises 8 bits, and in step 2, a frame of the OLED display device is divided into 8 sub-frames;
wherein the first TFT has a gate connected to a first scan signal, a source connected to a data signal, and a drain connected to a first node;

the second TFT has a gate connected to the first node, a source connected to an anode of the OLED, and a drain connected to a power source positive voltage;

the third TFT has a gate connected to a second scan signal, a source connected to a reference voltage, and a drain connected to the first node;

the capacitor has one end connected to the first node and the other end connected to the drain of the second TFT;

and the OLED has a cathode connected to a power source negative voltage;

wherein the reference voltage equals to 0.

11. The digital driving method for OLED display device as claimed in claim 10, wherein the maximum frame rate of the OLED display device is 1140 Hz.

12. The digital driving method for OLED display device as claimed in claim 11, wherein the 8 sub-frames comprises three unequal-length sub-frames and five equal-length sub-frames, and the time weights of the three unequal-length sub-frames are: 1: ½: ¼.

13. The digital driving method for OLED display device as claimed in claim 10, wherein the maximum frame rate of the OLED display device is 720 Hz.

14. The digital driving method for OLED display device as claimed in claim 13, wherein the 8 sub-frames comprises two unequal-length sub-frames and six equal-length sub-frames, and the time weights of the two unequal-length sub-frames are: 1: ½.

* * * * *